United States Patent
Ota et al.

(10) Patent No.: US 10,658,579 B2
(45) Date of Patent: May 19, 2020

(54) STORAGE DEVICE

(71) Applicant: Toshiba Memory Corporation, Tokyo (JP)

(72) Inventors: Kensuke Ota, Yokkaichi Mie (JP); Yoko Yoshimura, Yokkaichi Mie (JP); Yoshihiko Moriyama, Setagaya Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/290,546

(22) Filed: Mar. 1, 2019

(65) Prior Publication Data

US 2020/0020854 A1    Jan. 16, 2020

(30) Foreign Application Priority Data

Jul. 10, 2018   (JP) .................................. 2018-130453

(51) Int. Cl.
*H01L 45/00*    (2006.01)
*H01L 27/24*    (2006.01)

(52) U.S. Cl.
CPC ............ *H01L 45/08* (2013.01); *H01L 27/249* (2013.01); *H01L 45/1233* (2013.01); *H01L 45/1253* (2013.01); *H01L 45/147* (2013.01)

(58) Field of Classification Search
CPC . H01L 45/08; H01L 45/1253; H01L 45/1233; H01L 45/147; H01L 27/249
See application file for complete search history.

(56) References Cited

U.S. PATENT DOCUMENTS

| | | | | |
|---|---|---|---|---|
| 8,913,418 B2* | 12/2014 | Wang | .................. | G11C 13/0002 257/4 |
| 9,246,085 B1* | 1/2016 | Wang | ...................... | H01L 45/08 |
| 2013/0344649 A1* | 12/2013 | Gallo | .................... | H01L 45/085 438/104 |
| 2014/0001429 A1 | 1/2014 | He et al. | | |
| 2014/0185358 A1* | 7/2014 | Jo | ...................... | G11C 13/0007 365/148 |
| 2015/0102279 A1* | 4/2015 | Fujii | .................. | G11C 13/0007 257/4 |
| 2017/0141303 A1 | 5/2017 | Chen | | |

FOREIGN PATENT DOCUMENTS

| | | |
|---|---|---|
| JP | 2011054766 A | 3/2011 |
| JP | 2013058792 A | 3/2013 |

* cited by examiner

*Primary Examiner* — Allison Bernstein
(74) *Attorney, Agent, or Firm* — Kim & Stewart LLP

(57) ABSTRACT

A storage device includes a first conductive layer and a second conductive layer, with an intermediate layer therebetween. The intermediate layer includes a first and second compound regions. The first compound region includes first and second adjacent portions and the second compound region includes third and fourth adjacent portions. Electrical resistance between the first and second conductive layers changes according to a polarity applied across the intermediate layer. In a first polarity state, a concentration of a first element in the first portion is higher than a concentration of the first element in the second portion of the first compound region. A thickness of the third portion in the first polarity state is greater than the thickness of the fourth portion in the first polarity state.

20 Claims, 6 Drawing Sheets

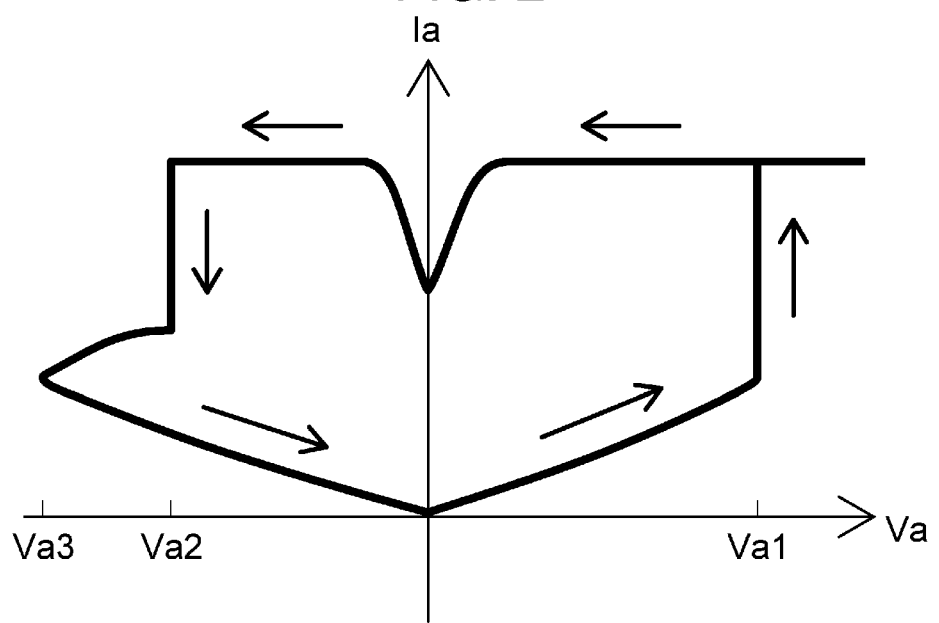

STORAGE DEVICE

CROSS-REFERENCE TO RELATED APPLICATION

This application is based upon and claims the benefit of priority from Japanese Patent Application No. 2018-130453, filed Jul. 10, 2018, the entire contents of which are incorporated herein by reference.

FIELD

Embodiments described herein relate generally to a storage device.

BACKGROUND

Some storage devices use a variable resistance layer. Such storage devices desirably operate stably.

DESCRIPTION OF THE DRAWINGS

FIG. 2 is a diagram illustrating an operational characteristic of the storage device according to a first embodiment.

DETAILED DESCRIPTION

Figure 1A:
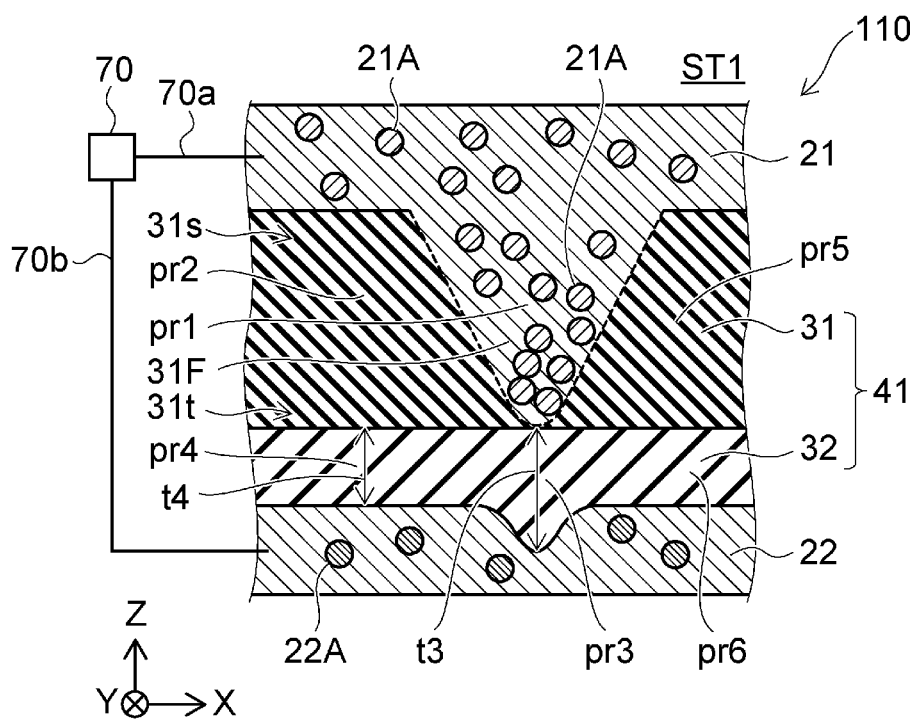
FIGS. 1A and 1B are schematic cross-sectional views illustrating a storage device according to a first embodiment.

In general, according to one embodiment, a storage device comprises a first conductive layer including a first element, a second conductive layer including a second element; and a first intermediate layer between the first conductive layer and the second conductive layer in a first direction. The first intermediate layer includes a first compound region and a second compound region between the first compound region and the second conductive layer in the first direction. The second compound region comprises an oxide of the second element. The first compound region includes a first partial region and a second partial region adjacent to the first partial region in a second direction intersecting the first direction. The second compound region includes a third partial region and a fourth partial region adjacent to the third partial region in the second direction. An electrical resistance between the first conductive layer and the second conductive layer is higher in a first state of the first intermediate layer than an electrical resistance between the first conductive layer and the second conductive layer in a second state of the first intermediate layer. The first and second states of the first intermediate layer caused by application of opposite polarity potentials across the first intermediate layer. In the first state, a concentration of the first element in the first partial region is higher than a concentration of the first element in the second partial region. Additionally, the thickness, in the first direction, of the third partial region in the first state is greater than the thickness, in the first direction, of the fourth partial region in the first state.

Example embodiments of the present disclosure will now be described with reference to the drawings.

The drawings are schematic or conceptual; thus, the relationship between the thickness and the width of a component or element, the size ratio between components or elements, etc. are not necessarily to scale. The same component(s) or element(s) may be depicted in different sizes or ratios in different drawings.

In the drawings and in the following description, the same reference numerals are used for the same or similar components or elements, and a duplicate description thereof will sometimes be omitted.

First Embodiment

Figure 1B:
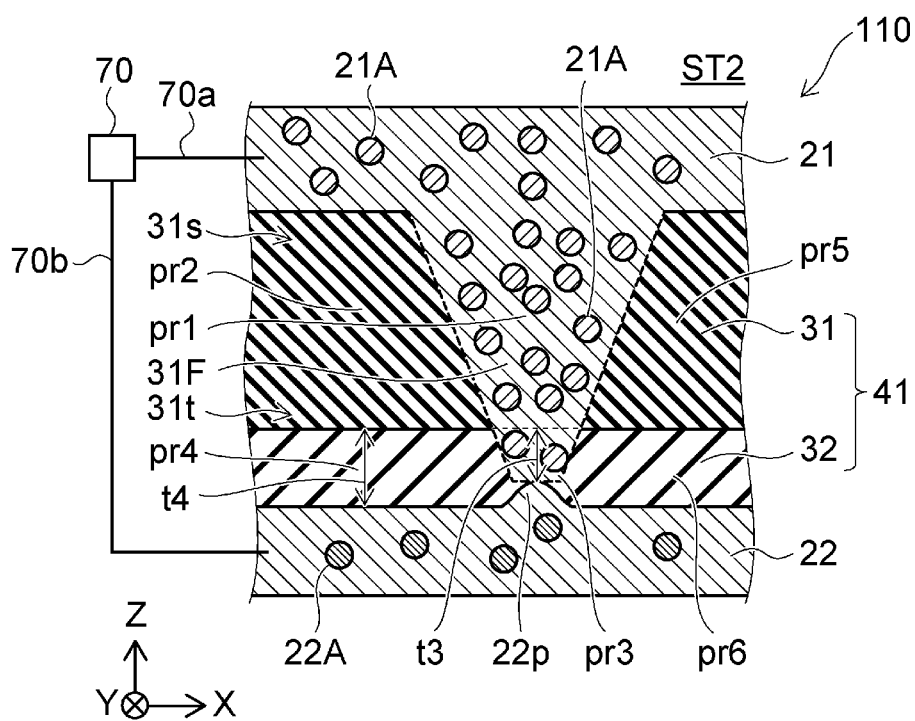

FIGS. 1A and 1B are schematic cross-sectional views illustrating a storage device according to a first embodiment.

These figures illustrate different states of the storage device. FIG. 1A illustrates a first state ST1, and FIG. 1B illustrates a second state ST2.

As shown in FIG. 1A, the storage device 110 according to this first embodiment includes a first conductive layer 21, a second conductive layer 22 and a first intermediate layer 41.

The storage device 110 of this example also includes a controller 70 which is electrically connected to the first conductive layer 21 and the second conductive layer 22. The controller 70 is, for example, electrically connected to the first conductive layer 21 by interconnects 70a. The controller 70 is, for example, electrically connected to the second conductive layer 22 by interconnects 70b. A switching device, for example, may be provided in the interconnects. The controller 70A is configured to apply a voltage between the first conductive layer 21 and the second conductive layer 22.

The first conductive layer 21 contains a first element 21A. The first element 21A comprises, for example, at least one element selected from the group consisting of copper (Cu) and silver (Ag). The first element 21A may further comprise a plurality of different of elements. The following description illustrates a particular example where the first element 21A is copper (Cu).

The second conductive layer 22 contains a second element 22A. The second element 22A comprises, for example, at least one element selected from the group consisting of tungsten (W), molybdenum (Mo), aluminum (Al), nickel (Ni), tantalum (Ta) and chromium (Cr). The second element 22A may comprise a plurality of different of elements. The following description illustrates a particular example where the second element 22A is tungsten (W).

The direction from the second conductive layer 22 toward the first conductive layer 21 is parallel to a first direction. The first direction is herein referred to also as a Z-axis direction. A direction perpendicular to the Z-axis direction is referred to as an X-axis direction. A direction perpendicular to both the Z-axis direction and the X-axis direction is referred to as a Y-axis direction.

The first intermediate layer 41 is provided between the first conductive layer 21 and the second conductive layer 22. The first intermediate layer 41 includes a first compound region 31 and a second compound region 32. The second compound region 32 is provided between the first compound region 31 and the second conductive layer 22. The second compound region 32 contains an oxide of the second element 22A. When the second element 22A comprises tungsten (W), the second compound region 32 contains $WO_x$ (an oxide of tungsten).

The first intermediate layer 41 can be in either a first state ST1 (see FIG. 1A) or a second state ST2 (see FIG. 1B). The electrical resistance between the first conductive layer 21 and the second conductive layer 22 in the first state ST1 (first electrical resistance) is higher than the electrical resistance between the first conductive layer 21 and the second conductive layer 22 in the second state ST2 (second electrical resistance). The first state ST1 is referred to also as a high-resistance state. The second state ST2 is referred to also a low-resistance state. Such resistance states are related to information to be stored (e.g., binary data values). The first intermediate layer 41 functions as a memory cell.

The second state ST2 may be caused, for example, by making the electric potential of the second conductive layer 22 lower than the electric potential of the first conductive layer 21. The first state ST1 may be caused, for example, by making the electric potential of the second conductive layer 22 higher than the electric potential of the first conductive layer 21.

As shown in FIG. 1A, in the first state ST1, the first compound region 31 includes a first partial region pr1 and a second partial region pr2. The direction from the second partial region pr2 toward the first partial region pr1 intersects the first direction (Z-axis direction). In the cross section shown in FIG. 1A, the direction from the second partial region pr2 toward the first partial region pr1 is parallel to the X-axis direction. The direction from the second partial region pr2 toward the first partial region pr1 may be parallel to any direction along the X-Y plane.

The concentration of the first element 21A in the first partial region pr1 is higher than the concentration of the first element 21A in the second partial region pr2. For example, in first state ST1, a high-concentration region 31F containing the first element 21A at a high concentration is produced in the first compound region 31. The concentration of the first element 21A in the high-concentration region 31F is higher than the concentration of the first element 21A in the other region of the first compound region 31. Thus, the high-concentration region 31F is a local high-concentration region. The high-concentration region 31F is, for example, a filament.

The high-concentration region 31F is formed in the second state ST2 (see FIG. 1B), whereby the low-resistance state of the second state ST2 is produced. For example, when the electric potential of the second conductive layer 22 is made lower than the electric potential of the first conductive layer 21, the first element 21A contained in the first conductive layer 21 enters the first compound region 31, whereby the high-concentration region 31F is formed and the first intermediate layer 41 enters the second state ST2. When the electric potential of the second conductive layer 22 is then made higher than the electric potential of the first conductive layer 21, the high-concentration region 31F becomes shorter and the high-resistance state (first state ST1) is produced. The high-concentration region 31F partly remains after the first intermediate layer 41 has entered the first state ST1. The high-concentration region 31F in the first state ST1 corresponds to the first partial region pr1.

As shown in FIG. 1A, in the first state ST1, the second compound region 32 includes a third partial region pr3 and a fourth partial region pr4. The direction from the third partial region pr3 toward the first partial region pr1 is parallel to the first direction (Z-axis direction). The direction from the fourth partial region pr4 toward the second partial region pr2 is parallel to the first direction. The direction from the fourth partial region pr4 toward the third partial region pr3 intersects the first direction (Z-axis direction). In the cross section shown in FIG. 1A, the direction from the fourth partial region pr4 toward the third partial region pr3 is parallel to the X-axis direction. The direction from the fourth partial region pr4 toward the third partial region pr3 may be parallel to any direction along the X-Y plane.

In FIG. 1A, thickness t3 represents the thickness of the third partial region pr3 in the first direction (Z-axis direction) in the first state ST1, and thickness t4 represents the thickness of the fourth partial region pr4 in the first direction in the first state ST1. In this embodiment, the thickness t3 is larger than the thickness t4.

As shown in FIG. 1A, in the first state ST1, the high-concentration region 31F is separated from the second conductive layer 22. A high electric field is produced locally between the high-concentration region 31 and the second conductive layer 22. The locally high electric field causes part of the second element 22A, contained in the second conductive layer 22, to combine with oxygen. For example, when the second element 22A comprises W, an oxide of tungsten ($WO_x$) will be formed. The oxide of tungsten ($WO_x$) forms part of the second compound region 32. As a result, the thickness (thickness t3) of that portion becomes larger than the thickness (thickness t4) of the other portion.

The feature that the thickness t3 is larger than the thickness t4 produces the following: the resistance in the first state ST1 can be made higher as compared to the case where the thicknesses t3 and t4 are the same; the on/off ratio can be increased; a difference between the high-resistance state and the low-resistance state can be maintained stably; and good retention characteristics can be obtained. It therefore becomes possible to provide a storage device which can operate more stably.

As shown in FIG. 1B, the second compound region 32 in the second state ST2 also includes the third partial region pr3 and the fourth partial region pr4. In this example, the third partial region pr3 in the second state ST2 contains the first element 21A, the second element 22A and oxygen (O). For example, a high-concentration region 31F containing the first element 21A at a high concentration is formed in the second compound region 32 (e.g. $WO_x$ layer). This facilitates reduction in the electrical resistance between the first conductive layer 21 and the second conductive layer 22.

As shown in FIG. 1B, the thickness t3 of the third partial region pr3 in the first direction (Z-axis direction) in the second state ST2 may be smaller than the thickness t4 of the fourth partial region pr4 in the first direction in the second state ST2.

For example, as shown in FIG. 1B, the second conductive layer 22 may partly project toward the first conductive layer 21 to form a projecting portion 22P when the electric potential of the second conductive layer 22 is made higher than the electric potential of the first conductive layer 21. On the other hand, the potential difference produced causes the high-concentration region 31F, containing the first element 21A at a high concentration, to extend in a direction from the first conductive layer 21 toward the second conductive layer 22. Accordingly, the distance between the projecting portion 22P and the high-concentration region 31F becomes shorter. For example, the projecting portion 22P and the high-concentration region 31F may come into contact with each other. This facilitates the production of a low-resistance state and enables more stable operation of the device.

As shown in FIG. 1B, the high-concentration region 31F extends in a direction from the first conductive layer 21 toward the second conductive layer 22. Therefore, the concentration of the first element 21A in the first conductive layer 21 side of the first compound region 31 is higher than that in the second conductive layer 22 side (the second compound region 32 side) of the first compound region 31.

For example, in the first state ST1, the first compound region 31 includes a first-layer region 31s and a second-layer region 31t, as shown in FIG. 1A. The second-layer region 31t is provided between the first-layer region 31s and the second compound region 32. For example, the concentration of the first element 21A in the first-layer region 31s in the first state ST1 is higher than the concentration of the first element 21A in the second-layer region 31t in the first state ST1.

The first compound region 31 also includes the first-layer region 31s and the second-layer region 31t when in the second state ST2, as shown in FIG. 1B. The second-layer region 31t is provided between the first-layer region 31s and the second compound region 32. For example, the concentration of the first element 21A in the first-layer region 31s in the second state ST2 is higher than the concentration of the first element 21A in the second-layer region 31t in the second state ST2.

In this embodiment, the first compound region 31 contains, for example, $Z_{x1}Ca_{1-x1}MnO_3$ (0<x1<1). Here, "Z" represents, for example, at least one element selected from the group consisting of the elements represented by the atomic symbols Pr, La, Gd, Ce, Pm, Sm, Eu, Td, Dy, Ho, Er, Yb, and Lu. Also, "Ca" represent the element calcium, "Mn" represents the element manganese, and "O" represents the element oxygen. In some examples, "Z" may more particularly represent at least one element selected from the group consisting of the elements Pr, La and Gd. In one particular example, the first compound region 31 contains $Pr_{x1}Ca_{1-x1}MnO_3$ (0<x1<1).

As shown in FIG. 1A, in the first state ST1, the first compound region 31 may further include a fifth partial region pr5. The first partial region pr1 is provided between the second partial region pr2 and the fifth partial region pr5. The concentration of the first element 21A in the first partial region pr1 is higher than the concentration of the first element 21A in the fifth partial region pr5.

As shown in FIG. 1A, in the first state ST1, the second compound region 32 may further include a sixth partial region pr6. The third partial region pr3 is provided between the fourth partial region pr4 and the sixth partial region pr6. The thickness t3 of the third partial region pr3 in the first direction (Z-axis direction) in the first state ST1 is larger than the thickness of the sixth partial region pr6 in the first direction (Z-axis direction) in the first state ST1.

Specific characteristics of a storage device 110 will now be described.

FIG. 2 is a graphical diagram illustrating operational characteristics of the storage device according to the first embodiment.

FIG. 2 illustrates the voltage-current characteristic of the storage device 110. The abscissa axis of FIG. 2 corresponds to a voltage Va applied between the first conductive layer 21 and the second conductive layer 22. The voltage Va corresponds to the electric potential of the first conductive layer 21, determined with the electric potential of the second conductive layer 22 as a reference. The ordinate axis corresponds to an electric current Ia (absolute value) that flows between the first conductive layer 21 and the second conductive layer 22.

As shown in FIG. 2, when the absolute value of the voltage Va is increased in the positive domain of the voltage Va, the electric current Ia (absolute value) rises rapidly at a positive voltage Va1. This behavior corresponds to the transition from the high-resistance state to the low-resistance state. Even if the voltage Va is increased, the electric current Ia will be saturated. The low-resistance state is maintained in that high voltage range. When the voltage Va is then decreased, the electric current Ia is substantially maintained at a high value. When the voltage Va is further decreased, the current Ia (absolute value) drops rapidly at a negative voltage Vat. The electric current Ia further decreases, for example, at a negative voltage Va3. When the absolute value of the voltage Va is then decreased in the negative region, the electric current Ia further decreases. When the absolute value of the voltage Va is then increased in the positive region, the electric current Ia increases gradually, and as mentioned above, the electric current Ia) rises rapidly at the positive voltage Va1.

The transition from the high-resistance state to the low-resistance state at the voltage Va1 may be considered to correspond to the high-concentration region 31F reaching the second conductive layer 22. The rapid drop of the electric current Ia at the voltage Va2 may be considered to correspond to the high-concentration region 31F leaving (disconnecting from) the second conductive layer 22. The behavior upon the transition from the negative voltage Va2 to the negative voltage Va3 may be considered to correspond to the increase in the thickness t3 of the third partial region pr3.

The controller 70 makes the electric potential of the first conductive layer 21 lower than the electric potential of the second conductive layer 22 to form the first state ST1. The controller 70 makes the electric potential of the first conductive layer 21 higher than the electric potential of the second conductive layer 22 to form the second state ST2.

Figure 3A:
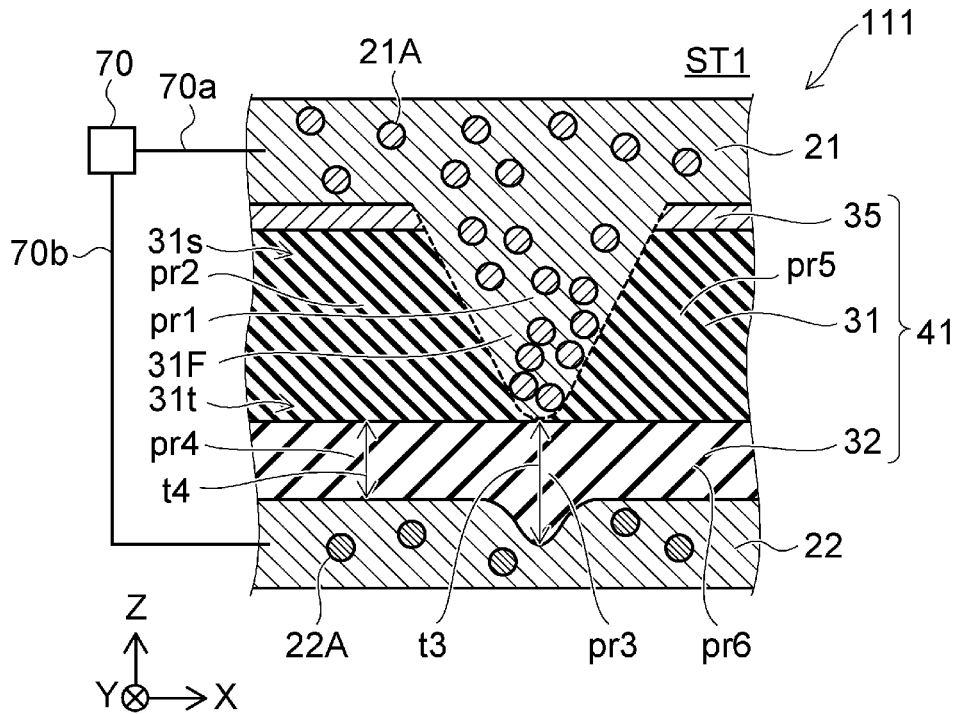
FIGS. 3A and 3B are schematic cross-sectional views illustrating a storage device according to a first embodiment.
Figure 3B:
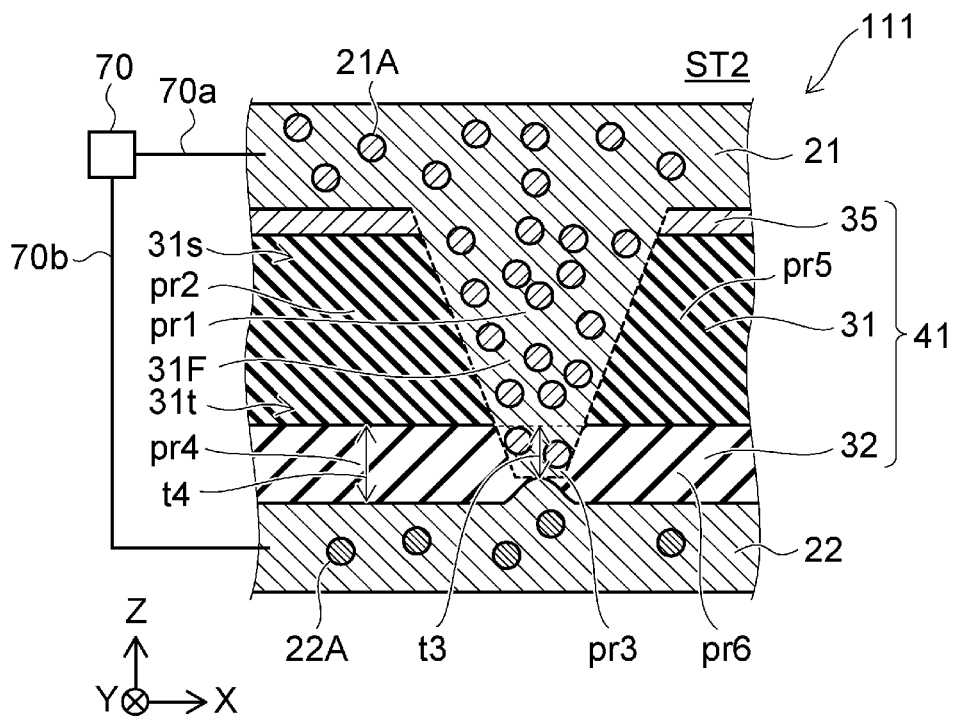

FIGS. 3A and 3B are schematic cross-sectional views illustrating a storage device according to the first embodiment.

FIG. 3A illustrates a first state ST1, and FIG. 3B illustrates a second state ST2.

As shown in FIG. 3A, the storage device 111 according to this first embodiment includes the first conductive layer 21, the second conductive layer 22 and the first intermediate layer 41. In the storage device 111, the first intermediate layer 41 includes a first intermediate region 35 in addition to the first compound region 31 and the second compound region 32.

The first intermediate region 35 is provided between the first conductive layer 21 and the first compound region 31. The first intermediate region 35 contains at least one compound selected from the group consisting of titanium-tungsten (TiW), tantalum (Ta), silicon dioxide ($SiO_2$), aluminum oxide ($AlO_x$), tantalum oxide ($TaO_x$) and silicon nitride (SiN). The provision of the first intermediate region 35 can prevent the first element 21A from entering the first compound region 31 excessively from the first conductive layer 21. This enables more stable operation of the device.

In one example, the thickness of the first intermediate region 35 in the first direction (Z-axis direction) is not more than the thickness of the first compound region 31 in the first direction. If the thickness of the first intermediate region 35 is excessively large, it is difficult for the first element 21A to migrate from the first conductive layer 21 into the first compound region 31, resulting in a too high operating voltage, for example. The thickness of the first intermediate region 35 in the first direction (Z-axis direction) is preferably not less than 0.25 nm. If the thickness of the first intermediate region 35 is less than 0.25 nm, it is difficult to prevent the first element 21A from entering the first compound region 31 excessively.

Second Embodiment

Figure 4A:
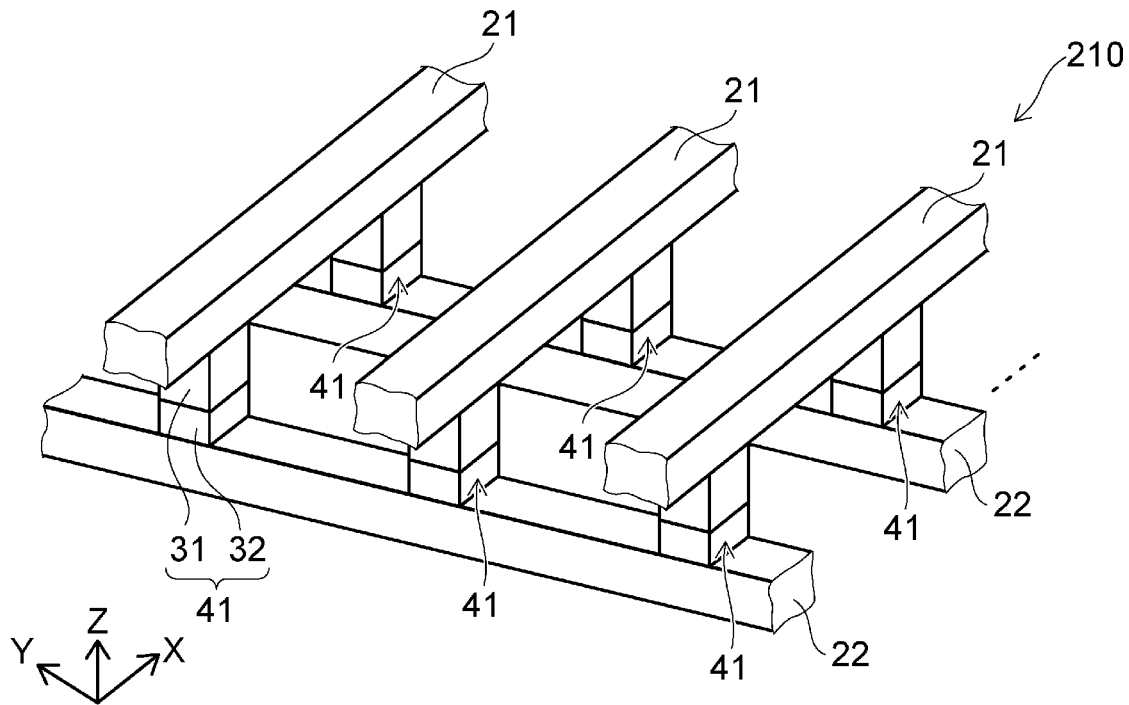
FIGS. 4A and 4B are schematic perspective views each illustrating a storage device according to a second embodiment.
Figure 4B:
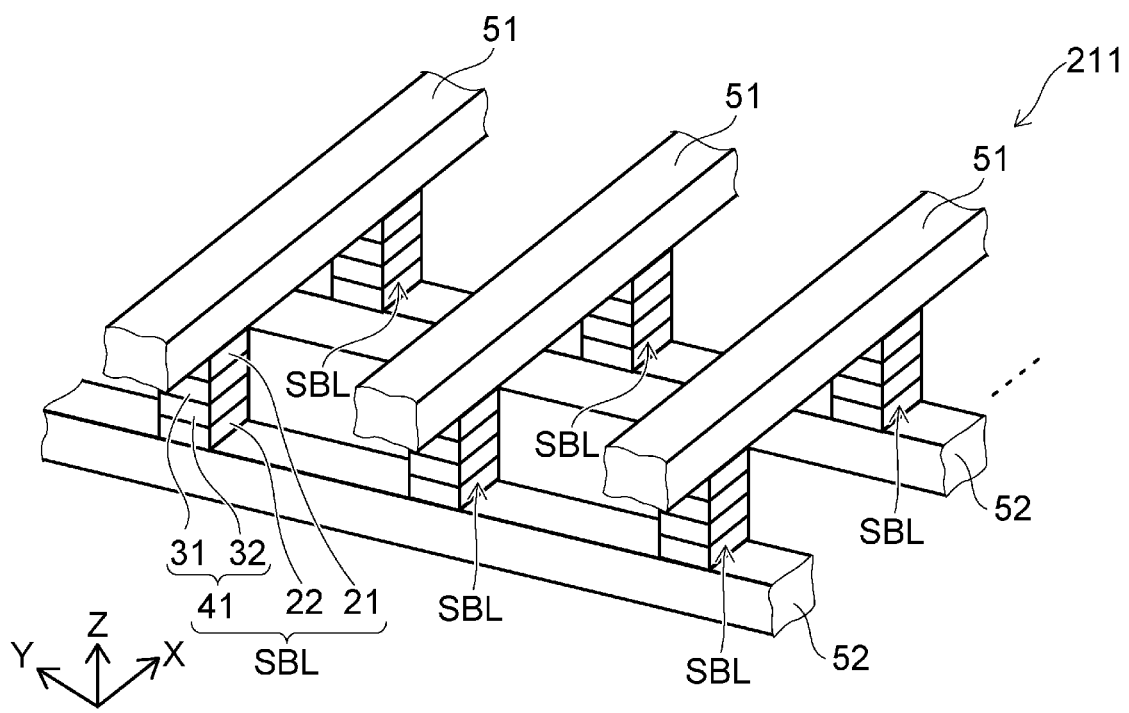

FIGS. 4A and 4B are schematic perspective views illustrating storage devices according to a second embodiment.

As shown in FIG. 4A, in a storage device 210, each first conductive layer 21 extends in a second direction that intersects a first direction (Z-axis direction). In this example, the second direction is parallel to an X-axis direction. Each second conductive layer 22 extends in a third direction that intersects a plane (Z-X plane) including the first direction (Z-axis direction) and the second direction (X-axis direction). In this example, the third direction is parallel to a Y-axis direction.

A plurality of first conductive layers 21 are provided in this example. The first conductive layers 21 are arranged next to each other in the third direction. A plurality of second conductive layers 22 are provided in this example. The second conductive layers 22 are arranged next to each other in the second direction. A first intermediate layer 41 is provided between each of the first conductive layers 21 and each of the second conductive layers 22.

As shown in FIG. 4B, a storage device 211 includes first interconnects 51 and second interconnects 52. The first interconnects 51 extend in the second direction that intersects the first direction (Z-axis direction). In this example, the second direction is parallel to the X-axis direction. The second interconnects 52 extend in the third direction that intersects a plane (Z-X plane) including the first direction (Z-axis direction) and the second direction (X-axis direction). In this example, the third direction is parallel to the Y-axis direction. First conductive layers 21 are provided between the first interconnects 51 and the second interconnects 52. Second conductive layers 22 are provided between the first conductive layers 21 and the second interconnects 52. Laminates SBL, each comprising a first conductive layer 21, a second conductive layer 22 and a first intermediate layer 41, are provided between the first interconnects 51 and the second interconnects 52.

A plurality of first interconnects 51 are provided in this example. The first interconnects 51 are arranged next to each other in the third direction. A plurality of second interconnects 52 are provided in this example. The second interconnects 52 are arranged next to each other in the second direction. Each laminate SBL is provided between one of the first interconnects 51 and one of the second interconnects 52.

In one embodiment, the first interconnects 51 may be first conductive layers 21. The second interconnects 52 may be second conductive layers 22.

A plurality of first intermediate layers 41 are provided in the storage devices 210 and 211. Each of the first intermediate layers 41 functions as a memory cell.

Figure 5:
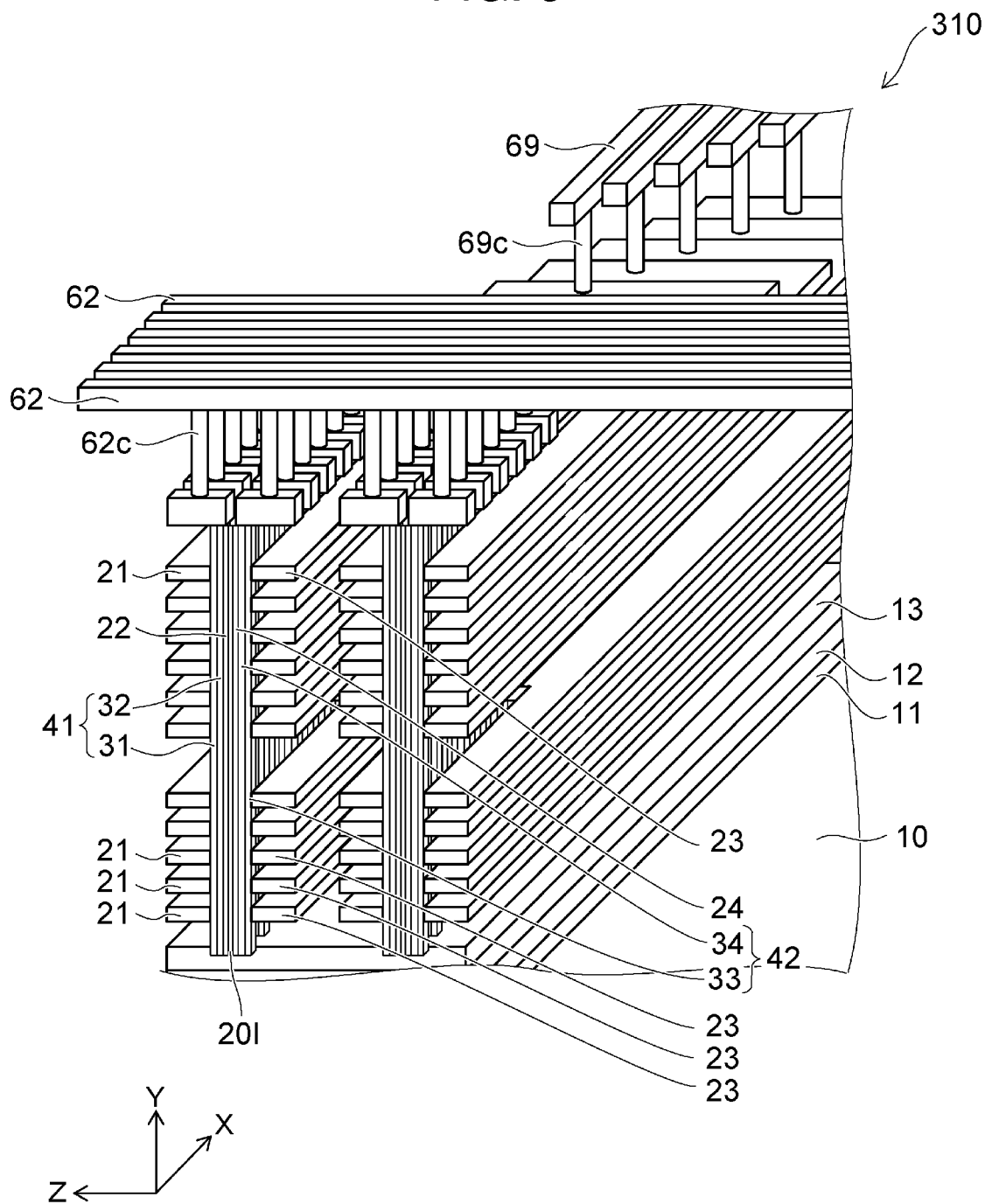
FIG. 5 is a schematic perspective view illustrating a storage device according to a second embodiment.

FIG. 5 is a schematic perspective view illustrating a storage device according to the second embodiment.

The illustration of at least part of an insulating portion is omitted from FIG. 5 for the sake of easier understanding.

As shown in FIG. 5, a plurality of first conductive layers 21 are provided in the storage device 310. The first conductive layers 21 extend in a second direction (X-axis direction) that intersects a first direction (Z-axis direction). In this example, the second direction is parallel to the X-axis direction. The first conductive layers 21 are disposed spaced from each other in a third direction that intersects a plane including the first direction and the second direction. In this example, the third direction is parallel to the Y-axis direction.

A second conductive layer 22 extends in the third direction (Y-axis direction in this example). A first intermediate layer 41 is provided between one of the first conductive layers 21 and the second conductive layer 22. For example, the first intermediate layer 41 is provided between each of the first conductive layers 21 and the second conductive layer 22.

For example, the first intermediate layer 41 includes a portion that overlaps one of the first conductive layers 21 in the first direction (Z-axis direction), and a portion that overlaps another one of the first conductive layers 21 in the first direction. Further, the first intermediate layer 41 includes a portion that overlaps, in the first direction, an area located between the one of the first conductive layers 21 and the another one of the first conductive layers 21. An insulating portion can be provided between the each of the first conductive layers 21 and its adjacent the first conductive layers 21. For example, the first intermediate layer 41 overlaps the insulating portion in the first direction.

As depicted, the second conductive layer 22 and the first intermediate layer 41 constitutes a columnar member. The columnar member extends in the Y-axis direction. A plurality of such columnar members are arranged in the X-axis direction.

As shown in FIG. 5, the storage device 310 further includes a plurality of third conductive layers 23, a fourth conductive layer 24 and a second intermediate layer 42. The third conductive layers 23 contain the above-described first element 21A. The fourth conductive layer 24 contains the above-described second element 22A. The direction from each third conductive layer 23 toward the fourth conductive layer 24 is parallel to the first direction (Z-axis direction).

The second intermediate layer 42 is provided between one of the third conductive layers 23 and the fourth conductive layer 24. For example, the second intermediate layer 42 is provided between each of the third conductive layers 23 and the fourth conductive layer 24.

The third conductive layers 23 extend in the second direction (e.g. the X-axis direction). The third conductive layers 23 are disposed spaced from each other in the third direction (e.g. the Y-axis direction). The fourth conductive layer 24 extends in the third direction (e.g. the Y-axis direction).

In this example, the direction from one of the first conductive layers 21 toward one of the third conductive layers 23 is parallel to the Z-axis direction. For example, the third conductive layers 23 are disposed spaced from the first conductive layers 21 in the Z-axis direction.

Apart of the second conductive layer 22 is provided between one of the third conductive layers 23 and one of the first conductive layers 21. A part of the fourth conductive layer 24 is provided between the part of the second conductive layer 22 and the one of the third conductive layers 23.

For example, the fourth conductive layer 24 and the second intermediate layer 42 constitutes a columnar member. The columnar member extends in the Y-axis direction. A plurality of such columnar members are arranged in the X-axis direction. The columnar member consisting of the fourth conductive layer 24 and the second intermediate layer 42 may be integrated with the columnar member consisting of the second conductive layer 22 and the first intermediate layer 41. An insulating portion 201 may be provided between the second conductive layer 22 and the fourth conductive layer 24.

A substrate 10 is provided in this example. A silicon oxide film 11 is provided on the substrate 10. An interlayer insulating film 12 and a conductive film 13 are provided on the silicon oxide film 11. One-side ends of the second conductive layer 22 and the fourth conductive layer 24 are electrically connected to the conductive film 13, while the other ends of the second conductive layer 22 and the fourth conductive layer 24 are electrically connected to one of a plurality of bit lines 62 via a connecting portion 62c. Each of the first conductive layers 21 and each of the third conductive layers 23 are electrically connected to one of a plurality of word lines 69 via a connecting portion 69c. For example, the bit lines 62 and the word lines 69 are electrically connected to the controller 70.

The construction (and material) of the first conductive layer 21, the construction (and material) of the second conductive layer 22 and the construction (and material) of the first intermediate layer 41 can be applied to the third conductive layer 23, the fourth conductive layer 24 and the second intermediate layer 42, respectively. The second intermediate layer 42 between one of the third conductive layers 23 and one of the fourth conductive layers 24 functions as one of memory cells.

Figure 6A:
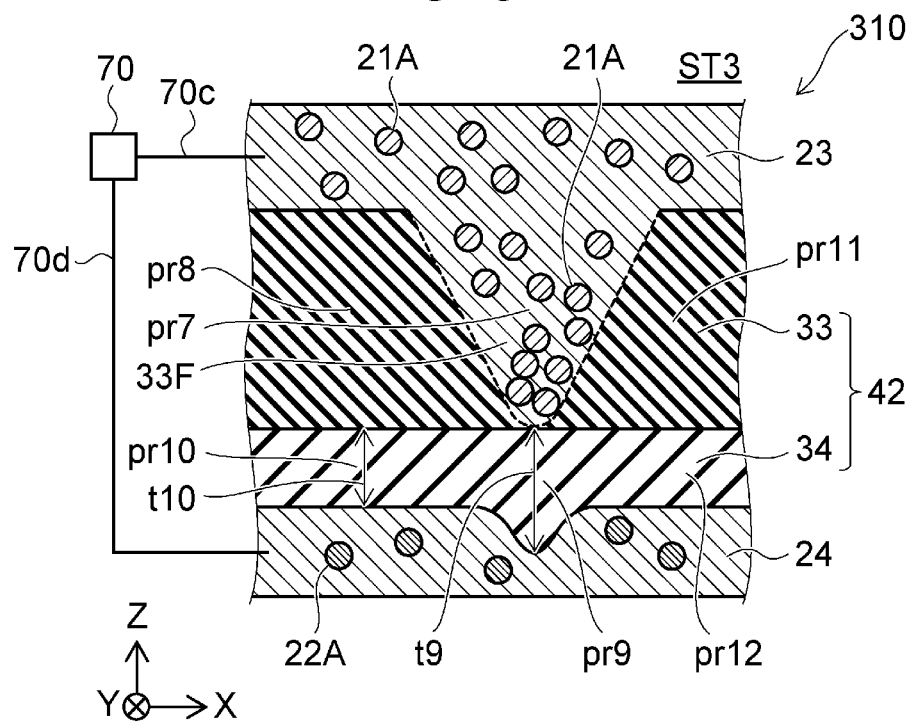
FIGS. 6A and 6B are schematic cross-sectional views illustrating the storage device according to a second embodiment.
Figure 6B:
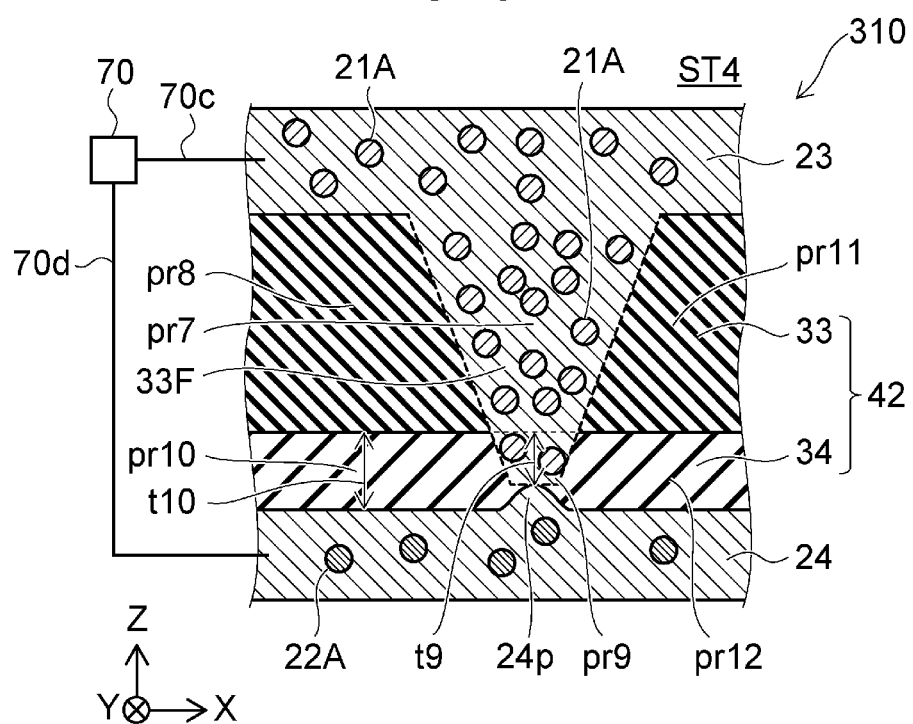

FIGS. 6A and 6B are schematic cross-sectional views illustrating the storage device according to a second embodiment.

These figures illustrate two states of the second intermediate layer 42 (corresponding to one of memory cells). FIG. 6A illustrates a third state ST3, and FIG. 6B illustrates a fourth state ST4. The third state ST3 may be considered the same as the first state ST1. The fourth state ST4 may be considered the same as the second state ST2. The electrical resistance between the third conductive layer 23 and the fourth conductive layer 24 in the third state ST3 (third electrical resistance) is higher than the electrical resistance between the third conductive layer 23 and the fourth conductive layer 24 in the fourth state ST4 (fourth electrical resistance). The third state ST3 is, for example, a high-resistance state. The fourth state ST4 is, for example, a low-resistance state.

The controller 70 is electrically connected to the third conductive layer 23 by interconnects 70c or the like. The controller 70 is electrically connected to the fourth conductive layer 24 by interconnects 70d or the like.

As shown in FIG. 6A, the second intermediate layer 42 includes a third compound region 33 and a fourth compound region 34. The fourth compound region 34 is provided between the third compound region 33 and the fourth conductive layer 24. The fourth compound region 34 contains an oxide of the second element 22A. The construction (including the material) of the first compound region 31 and the construction of the second compound region 32 can be applied to the third compound region 33 and the fourth compound region 34, respectively.

As shown in FIG. 6A, in the third state ST3, the third compound region 33 includes a seventh partial region pr7 and an eighth partial region pr8. The direction from the eighth partial region pr8 toward the seventh partial region pr7 intersects the first direction (Z-axis direction). The concentration of the first element 21A in the seventh partial region pr7 is higher than the concentration of the first element 21A in the eighth partial region pr8. For example, the seventh partial region pr7 corresponds to a high-concentration region 33F. The concentration of the first element 21A in the high-concentration region 33F is higher than the concentration of the first element 21A in the other regions of the third compound region 33.

In the third state ST3, the fourth compound region 34 includes a ninth partial region pr9 and a tenth partial region pr10. The direction from the ninth partial region pr9 toward the seventh partial region pr7 is parallel to a first direction (Z-axis direction). The direction from the tenth partial region pr10 toward the eighth partial region pr8 is parallel to the first direction (Z-axis direction).

In FIG. 6A, thickness t9 represents the thickness of the ninth partial region pr9 in the first direction (Z-axis direction) in the third state ST3, and thickness t10 represents the thickness of the tenth partial region pr10 in the first direction in the third state ST3. The thickness t9 is larger than the thickness t10. Therefore, a difference between the high-resistance state and the low-resistance state can be maintained stably in the second intermediate layer 42. For example, good retention characteristics can be obtained. It therefore becomes possible to provide a storage device which can operate more stably.

The fourth compound region 34 includes the ninth partial region pr9 and the tenth partial region pr10 also in the fourth state ST4 shown in FIG. 6B. The ninth partial region pr9 in the fourth state ST4 may contain, for example, the first element 21A, the second element 22A and oxygen.

As shown in FIG. 6B, the thickness t9 of the ninth partial region pr9 in the first direction in the fourth state ST4 may be smaller than the thickness t10 of the tenth partial region pr10 in the first direction in the fourth state ST4. A projecting portion 24p may be provided in the fourth conductive layer 24. For example, a difference between the high-resistance state and the low-resistance state can be produced more stably. It therefore becomes possible to provide a storage device which can operate stably.

As shown in FIG. 6A, in the third state ST3, the third compound region 33 may further include an eleventh partial region pr11. The seventh partial region pr7 is provided between the eighth partial region pr8 and the eleventh partial region pr11. The concentration of the first element 21A in the seventh partial region pr7 is higher than the concentration of the first element 21A in the eleventh partial region pr11.

As shown in FIG. 6A, in the third state ST3, the fourth compound region 34 may further include a twelfth partial region pr12. The ninth partial region pr9 is provided between the tenth partial region pr10 and the twelfth partial region pr12. For example, the thickness t9 of the ninth partial region pr9 in the first direction in the third state ST3 is larger than the thickness of the twelfth partial region pr12 in the first direction in the third state ST3.

The second intermediate layer 42 also may include the first intermediate region 35 (see FIG. 3A) in addition to the third compound region 33 and the fourth compound region 34. The first intermediate region 35 is provided between the third compound region 33 and the third conductive layer 23.

This embodiment makes it possible to provide a storage device which can operate stably.

The phrase "electrically connected" as used herein includes a state in which one or more conductors in which electric current flows are physically in contact with each other, and also a state in which electric current flows between the electrically connected conductors via inclusion of some other conductor (s) interposed therebetween.

The terms "perpendicular" and "parallel" used herein should not be bound to their strictest geometrical sense, and should be construed to mean "substantially perpendicular" and "substantially parallel", allowing for variation due to manufacturing process, measurement errors, and the like.

Embodiments of the present disclosure have been described with reference to specific examples; however, it is understood that the present disclosure is not limited to the specific examples. For example, specific constructions of various components or elements of a storage device, such as a conductive layer, an intermediate layer, a compound region, interconnects, a circuit portion, etc., will be encompassed by the scope of the present disclosure as long as those of ordinary skill in the art, through appropriate selection within the scope of known technology, can make and use the present disclosure in the same manner and can produce the same effects.

Those combinations of two or more of the components or elements, as described above with reference to the specific examples, which are technically feasible should also be considered encompassed within the scope of the present disclosure.

Storage devices which can be made by one skilled in the art through common design changes in any one of the above-described storage devices according to the embodiments of the present disclosure, should also be considered encompassed by the scope of the present disclosure as long as such storage devices still incorporate the technical concepts of the present disclosure.

It is understood that those of ordinary skill in the art would make various changes and modifications in implementing the embodiments of the present disclosure; however, such changes and modifications are to be considered within the scope of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising:
a first conductive layer including a first element;
a second conductive layer including a second element; and
a first intermediate layer between the first conductive layer and the second conductive layer in a first direction, the first intermediate layer including a first compound region and a second compound region between the first compound region and the second conductive layer in the first direction, the second compound region comprising an oxide of the second element, wherein
the first compound region includes a first partial region and a second partial region adjacent to the first partial region in a second direction intersecting the first direction, and the second compound region includes a third partial region and a fourth partial region adjacent to the third partial region in the second direction;
an electrical resistance between the first conductive layer and the second conductive layer is higher in a first state of the first intermediate layer than an electrical resistance between the first conductive layer and the second conductive layer in a second state of the first intermediate layer, the first and second states being caused by opposite polarity potentials being applied across the first intermediate layer;
in the first state, a concentration of the first element in the first partial region is higher than a concentration of the first element in the second partial region; and
the thickness, in the first direction, of the third partial region in the first state is greater than the thickness, in the first direction, of the fourth partial region in the first state.

2. The storage device according to claim 1, wherein in the second state, the third partial region includes the first element, the second element, and oxygen.

3. The storage device according to claim 1, wherein in the second state, the thickness, in the first direction, of the third partial region is less than the thickness, in the first direction, of the fourth partial region.

4. The storage device according to claim 1, wherein the first intermediate layer further includes a first intermediate region between the first conductive layer and the first compound region and comprising at least one material selected from the group of materials consisting of titanium-tungsten (TiW), tantalum (Ta), silicon dioxide ($SiO_2$), aluminum oxide ($AlO_x$), tantalum oxide ($TaO_x$), and silicon nitride (SiN).

5. The storage device according to claim 1, wherein the first compound region comprises a compound of general chemical formula $Z_{x1}Ca_{1-x1}MnO_3$, wherein $0<x1<1$, and Z represents an element selected from the group of elements consisting of Pr, La, Gd, Ce, Pm, Sm, Eu, Td, Dy, Ho, Er, Yb, and Lu.

6. The storage device according to claim 1, wherein the first compound region comprises a compound of general chemical formula $Pr_{x1}Ca_{1-x1}MnO_3$, with $0<x1<1$.

7. The storage device according to claim 6, wherein the first element comprises at least one of copper (Cu) and silver (Ag).

8. The storage device according to claim 7, wherein the second element is at least one element selected from the group of elements consisting of tungsten (W), molybdenum (Mo), aluminum (Al), nickel (Ni), tantalum (Ta), and chromium (Cr).

9. The storage device according to claim 1, wherein the first element comprises at least one of copper (Cu) and silver (Ag).

10. The storage device according to claim 1, wherein the second element is at least one element selected from the group of elements consisting of tungsten (W), molybdenum (Mo), aluminum (Al), nickel (Ni), tantalum (Ta), and chromium (Cr).

11. The storage device according to claim 1, wherein
the first conductive layer extends in the second direction, and
the second conductive layer extends in a third direction that intersects the first direction and the second direction.

12. The storage device according to claim 1, further comprising:
a plurality of the first conductive layers, wherein
each first conductive layer extends in the second direction,
the first conductive layers are spaced from each other in a third direction that intersects the first direction and the second direction,
the second conductive layer extends in the third direction, and
the first intermediate layer is between the second conductive layer and each of the first conductive layers.

13. The storage device according to claim 12, wherein the first intermediate layer includes:
a first portion that overlaps one of the first conductive layers in the first direction,
a second portion that overlaps another one of the first conductive layers in the first direction, and
a third portion that overlaps, in the first direction, an area between the one of the first conductive layers and the other one of the first conductive layers.

14. The storage device according to claim 12, further comprising:
  a plurality of third conductive layers including the first element;
  a fourth conductive layer including the second element, the fourth conductive layer spaced from one of the third conductive layers in the first direction; and
  a second intermediate layer between the one of the third conductive layers and the fourth conductive layer, wherein
  the third conductive layers extend in the second direction and are spaced from each other in the third direction,
  the fourth conductive layer extends in the third direction,
  a portion of the second conductive layer is between the third conductive layers and the first conductive layers, and
  a portion of the fourth conductive layer is between the portion of the second conductive layer and the third conductive layers.

15. The storage device according to claim 14, wherein the second intermediate layer includes:
  a third compound region including a fifth partial region and a sixth partial region adjacent to the fifth partial region in a direction parallel to the second direction, and
  a fourth compound region between the third compound region and the fourth conductive layer, the fourth compound region comprising an oxide of the second element and including a seventh partial region and an eighth partial region, the seventh partial region adjacent the fifth partial region in the first direction, the eighth partial region adjacent the sixth partial region in the first direction;
  an electrical resistance between the third conductive layer and the fourth conductive layer in a third state of the second intermediate layer is higher than an electrical resistance between the third conductive layer and the fourth conductive layer in a fourth state of the second intermediate layer, the third and fourth states being caused by opposite polarity potentials being applied across the second intermediate layer;
  in the third state, a concentration of the first element in the fifth partial region is higher than a concentration of the first element in the sixth partial region; and
  the thickness, in the first direction, of the seventh partial region in the third state is greater than the thickness, in the first direction, of the eighth partial region in the third state.

16. A semiconductor memory device, comprising:
  a first conductive layer in a first plane and including a first element;
  a second conductive layer in a second plane and including a second element, the first and second planes being substantially parallel and spaced from each other in a first direction; and
  a first intermediate layer between the first plane and the second plane, the first intermediate layer including a first compound region on a first side of the first intermediate layer adjacent the first conductive layer and a second compound region on a second side of the first intermediate layer adjacent the second conductive layer, the second compound region comprising an oxide of the second element, wherein
  the first compound region includes a first partial region and a second partial region adjacent to the first partial region in a second direction intersecting the first direction;
  the second compound region includes a third partial region and a fourth partial region adjacent to the third partial region in the second direction;
  an electrical resistance between the first conductive layer and the second conductive layer is higher in a first state of the first intermediate layer than an electrical resistance between the first conductive layer and the second conductive layer in a second state of the first intermediate, the first and second states being caused by opposite polarity potentials being applied across the first intermediate layer;
  in the first state, a concentration of the first element in the first partial region is higher than a concentration of the first element in the second partial region;
  when the first intermediate layer is in the first state, the thickness, in the first direction, of the third partial region is greater than the thickness, in the first direction, of the fourth partial region; and
  when the first intermediate layer is in the second state, the thickness, in the first direction, of the third partial region is less than the thickness, in the first direction, of the fourth partial region in the first state.

17. The semiconductor memory device according to claim 16, wherein the first compound region comprises a compound of general chemical formula $Z_{x1}Ca_{1-x1}MnO_3$, wherein $0<x1<1$, and Z represents an element selected from the group of elements consisting of Pr, La, Gd, Ce, Pm, Sm, Eu, Td, Dy, Ho, Er, Yb, and Lu.

18. The semiconductor memory device according to claim 16, wherein the first compound region comprises a compound of general chemical formula $Pr_{x1}Ca_{1-x1}MnO_3$, with $0<x1<1$.

19. The semiconductor memory device according to claim 16, wherein
  the first element comprises at least one of copper (Cu) and silver (Ag), and
  the second element is at least one element selected from the group of elements consisting of tungsten (W), molybdenum (Mo), aluminum (Al), nickel (Ni), tantalum (Ta), and chromium (Cr).

20. The semiconductor memory device according to claim 16, wherein the first intermediate layer further includes a first intermediate region between the first conductive layer and the first compound region and comprising at least one material selected from the group of materials consisting of titanium-tungsten (TiW), tantalum (Ta), silicon dioxide ($SiO_2$), aluminum oxide ($AlO_x$), tantalum oxide ($TaO_x$), and silicon nitride (SiN).

* * * * *